（12) United States Patent
Motoya et al.

(10) Patent No.: US 8,536,787 B2
(45) Date of Patent: Sep. 17, 2013

(54) GLASS COMPOSITION, LIGHT SOURCE DEVICE AND ILLUMINATION DEVICE

(75) Inventors: Atsushi Motoya, Shiga (JP); Yasuharu Ueno, Osaka (JP); Kazuyuki Okano, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/636,225

(22) PCT Filed: Apr. 19, 2011

(86) PCT No.: PCT/JP2011/002271
§ 371 (c)(1),
(2), (4) Date: Sep. 20, 2012

(87) PCT Pub. No.: WO2011/132402
PCT Pub. Date: Oct. 27, 2011

(65) Prior Publication Data
US 2013/0015761 A1    Jan. 17, 2013

(30) Foreign Application Priority Data
Apr. 19, 2010    (JP) ................. 2010-095681

(51) Int. Cl.
*H05B 33/04*    (2006.01)
(52) U.S. Cl.
USPC ........................................ 313/512; 362/234
(58) Field of Classification Search
USPC ........................................ 313/512; 362/234
See application file for complete search history.

(56) References Cited

U.S. PATENT DOCUMENTS

| 5,246,890 | A | 9/1993 | Aitken et al. |
| 2009/0086479 | A1* | 4/2009 | Suehiro et al. ................. 362/234 |
| 2010/0065882 | A1 | 3/2010 | Matsumoto et al. |
| 2012/0235181 | A1 | 9/2012 | Matsuda et al. |
| 2012/0293981 | A1 | 11/2012 | Motoya et al. |
| 2012/0300432 | A1 | 11/2012 | Matsubayashi et al. |

FOREIGN PATENT DOCUMENTS

| JP | 6-183775 | 7/1994 |
| JP | 2001-302279 | 10/2001 |
| JP | 2001302279 A | * 10/2001 |
| JP | 2002-160937 | 6/2002 |
| JP | 2005-11933 | 1/2005 |
| JP | 2008-300536 | 12/2008 |
| JP | 2009-270091 | 11/2009 |

OTHER PUBLICATIONS

English Translation of JP2001-302279 Oct. 31, 2001.*

(Continued)

*Primary Examiner* — Mary Ellen Bowman
(74) *Attorney, Agent, or Firm* — Greenblum & Bernstein, P.L.C.

(57) ABSTRACT

A glass composition including, in oxide-based mol %: (a) at least 30% and at most 50% $P_2O_5$, (b) at least 10% and at most 50% ZnO, (c) at least 0.1% and at most 10% $Al_2O_3$, (d) at least 0% and at most 50% $Li_2O$, (e) at least 0% and at most 50% $Na_2O$, (f) at least 0% and at most 50% $K_2O$, (g) at least 0% and at most 20% MgO, (h) at least 0% and at most 20% CaO, (i) at least 0% and at most 20% SrO, (j) at least 0% and at most 20% BaO, (k) at least 0% and at most 20% SnO, and (l) at least 0% and at most 5% $B_2O_3$, substantially not comprising $ZrO_2$ and $Ag_2O$, and (a)/(b), the ratio of (a) and (b), being at least 0.2 and at most 2.0.

8 Claims, 3 Drawing Sheets

(56) References Cited

OTHER PUBLICATIONS

U.S. Appl. No. 13/502,662 to Tsugihiro Matsuda et al., filed Apr. 18, 2012.

U.S. Appl. No. 13/582,330 to Atsushi Motoya et al., filed Aug. 31, 2012.

Search report from International Application No. PCT/JP2011/002271, mail date is Jun. 21, 2011.

* cited by examiner

GLASS COMPOSITION, LIGHT SOURCE DEVICE AND ILLUMINATION DEVICE

TECHNICAL FIELD

The present invention relates to a glass composition, and to a light source device and a lighting device that include the glass composition as a package material.

BACKGROUND ART

Conventionally, transparent resin materials such as silicone resin and epoxy resin have been widely used as materials (sealing materials) for sealing electronics components such as a semiconductor light-emitting element. However, there is a concern about these resin materials. That is to say, these resin materials have low resistance against moisture and heat. Also, another problem is that, when any of the resin materials is used as a package material for packaging a light-emitting element, the resin deteriorates over time by the ultraviolet emitted by the light-emitting element, and the light transmittance is reduced. Furthermore, although a material having a high transmittance is strongly desired as a package material for packaging a light-emitting element so as to realize high light extraction efficiency, many resin materials have a refractive index of approximately 1.5 at the highest, and thus a further improvement is expected. Note that in the present document, the semiconductor light-emitting element may be referred to simply as "light-emitting element" or "element".

Under such backgrounds, glass compositions have been considered as package materials for packaging light-emitting materials in recent years, from the viewpoints of the moisture resistance, heat resistance and high transmittance. For example, a $P_2O_5$—ZnO—SnO-based glass composition, whose major components are $P_2O_5$, ZnO and SnO, has been proposed (see, for example, Patent Literatures 1 and 2).

CITATION LIST

Patent Literature

[Patent Literature 1]
Japanese Patent Application Publication No. 2005-011933
[Patent Literature 2]
Japanese Patent Application Publication No. 2008-300536

SUMMARY OF INVENTION

Technical Problem

However, the glass compositions disclosed in Patent Literatures 1 and 2 are likely to enhance the crystal nucleation in the glass when the glass compositions are used as package materials for packaging light-emitting elements. In that case, when the glass composition is heated, crystals are deposited on or inside the surface of the glass, and opaque portions are likely to occur. In that case, the transparency loss may occur in the end. In a glass composition in which the transparency loss has occurred, the light transmittance of the package is reduced, which makes it difficult to obtain high light flux. Also, a material to be used as a package material for packaging a light-emitting element is desired to have a high refractive index. However, the glass compositions disclosed in Patent Literatures 1 and 2 do not appear to sufficiently satisfy the demand as well.

It is therefore an object of the present invention to provide a glass composition that restricts the transparency loss during heating, while being resistant against moisture and heat and having high refractive index, and when used as a package material for packaging a light-emitting element, realizes a high light transmittance without deteriorating by the ultraviolet emitted by the light-emitting element.

Solution to Problem

The inventors of the present invention continued an earnest study for a glass composition fulfilling the above object by focusing optimization of the components selected for the composition and the ratio of $P_2O_5$ and ZnO in a $P_2O_5$—ZnO—SnO-based glass composition, before reaching the present invention.

That is to say, the above object is fulfilled by [1] a glass composition comprising, in oxide-based mol %: (a) at least 30% and at most 50% $P_2O_5$, (b) at least 10% and at most 50% ZnO, (c) at least 0.1% and at most 10% $Al_2O_3$, (d) at least 0% and at most 50% $Li_2O$, (e) at least 0% and at most 50% $Na_2O$, (f) at least 0% and at most 50% $K_2O$, (g) at least 0% and at most 20% MgO, (h) at least 0% and at most 20% CaO, (i) at least 0% and at most 20% SrO, (j) at least 0% and at most 20% BaO, (k) at least 0% and at most 20% SnO, and (l) at least 0% and at most 5% $B_2O_3$, substantially not comprising ZrO, and $Ag_2O$, and (a)/(b), the ratio of (a) and (b), being at least 0.2 and at most 2.0.

Also, in the above glass composition of the present invention, it is preferable that [2] a total amount of (a) and (b) is at most 90% in mol %.

The above object is also fulfilled by a light source device comprising: a substrate; and a light-emitting element implemented on the substrate in a state of being sealed by the glass composition recited in the above [1] or [2].

In the above light source device, it is preferable that the substrate is made of ceramics. In this case, it is preferable that the thermal expansion coefficient of the glass composition is at least 6 ppm/° C. and at most 10 ppm/° C.

Furthermore, in the above light source devices, it is preferable that, regardless of a type of the substrate, the glass composition includes a phosphor material.

The above object is also fulfilled by a lighting device comprising: one of the above-described light source devices; a housing in which the one of the above-described light source devices is placed; and a base attached to the housing. In the above lighting device, it is preferable that the housing is made of a light-transmissive material.

Advantageous Effects of Invention

The above-described glass composition of the present invention is a $P_2O_5$—ZnO—SnO-based glass composition including $Al_2O_3$ as an additive component, wherein the additive amount of $Al_2O_3$ is controlled in an appropriate range, and the ratio of $P_2O_5$ and ZnO is controlled in an optimum range. The glass composition provides excellent resistance against moisture and heat while realizing a high refractive index, does not deteriorate over time by ultraviolet light emitted from the light-emitting element, and realizes high light transmittance. Thus the glass composition is very useful as a package material for packaging a light-emitting element since the transparency loss is not likely to occur even during heating.

DESCRIPTION OF EMBODIMENTS

Figure 1:
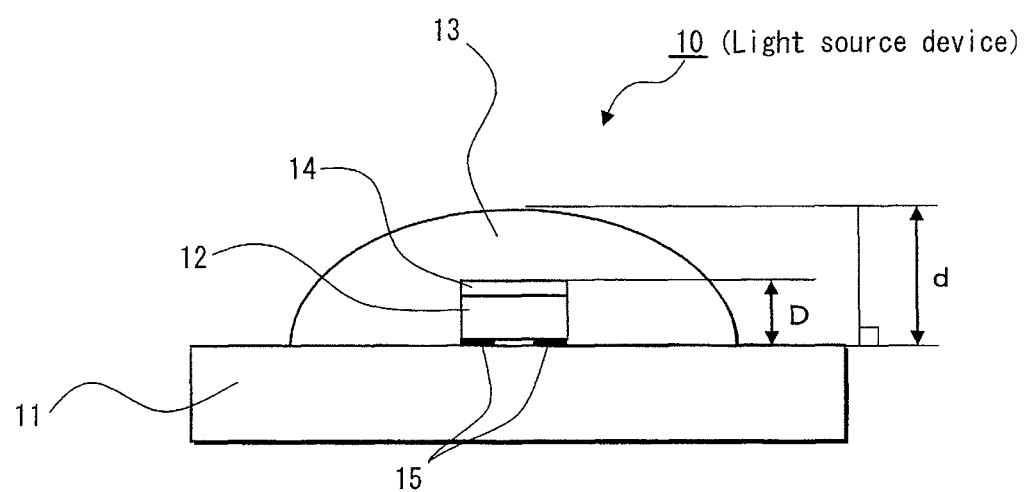
FIG. 1 is a cross-sectional view of a light source device in which the glass composition of the present invention is used as a package material.

The following describes one embodiment of the present invention with reference to the attached drawings. In the following description of the present invention, each numerical range including a sign "-" indicates that the numerical range includes values on both sides of the sign "-". Also, note that the drawings are not necessarily to scale. Furthermore, in the following description, "mol %" may be represented merely as "%".

[Glass Composition]

One example of the glass composition of the present invention comprises, in oxide-based mol %: (a) at least 30% and at most 50% $P_2O_5$, (b) at least 10% and at most 50% ZnO, (c) at least 0.1% and at most 10% $Al_2O_3$, (d) at least 0% and at most 50% $Li_2O$, (e) at least 0% and at most 50% $Na_2O$, (f) at least 0% and at most 50% $K_2O$, (g) at least 0% and at most 20% MgO, (h) at least 0% and at most 20% CaO, (i) at least 0% and at most 20% SrO, (j) at least 0% and at most 20% BaO, (k) at least 0% and at most 20% SnO, and (l) at least 0% and at most 5% $B_2O_3$, substantially not comprising $ZrO_2$ and $Ag_2O$, and (a)/(b), the ratio of (a) and (b), being at least 0.2 and at most 2.0.

The above component (a) $P_2O_5$ is indispensable for forming the framework of the glass. Here, if $P_2O_5$ is less than 30% or more than 50%, the crystal nucleation in the glass is enhanced, and the transparency loss occurrence level becomes high. For the above reason, the additive amount of $P_2O_5$ is preferably at least 30% and at most 50%, and more preferably, at least 35% and at most 45%.

The above component (b) ZnO is, as well as $P_2O_5$, indispensable for forming the framework of the glass since it produces an effect of reducing the viscosity to facilitate melting when the glass is melted. Here, if a glass composition includes less than 10% ZnO, the refractive index of the glass might become low, the viscosity of glass in melting does not become low, and merely a deformation point as high as 500° C. is obtained. The deformation point means a temperature at which the thermal expansion curve is at the peak maximum, namely a temperature at which, in appearance, the glass expansion stops and starts to contract. Thus a glass composition including less than 10% ZnO and having deformation point of approximately 500° C. might deteriorate easily when it is subjected to heating of approximately 450° C. On the other hand, if a glass composition includes more than 50% ZnO (the above component (b)), the thermal expansion coefficient of the glass composition becomes 11 ppm/° C., and thus, if it is used together with, for example, a substrate made of ceramics, the difference in thermal expansion coefficient among the members becomes large, cracks are likely to occur in the interfacial surface between different types of members. Accordingly, from the viewpoint of realizing a high refractive index and a desired thermal expansion coefficient and the like, the additive amount of ZnO is preferably at least 10% and at most 50% when an optical device is manufactured in combination with a substrate made of ceramics (having thermal expansion coefficient of at least 6 ppm/° C. and at most 10 ppm/° C.).

The above component (c) $Al_2O_3$ is indispensable for the glass composition of the present invention since it acts as an intermediate oxide, improves the durability of the glass against chemical materials, restricts crystallization during heating, and prevents the transparency loss. If $Al_2O_3$ contained in a glass composition is less than 0.1%, $Al_2O_3$ cannot act as an intermediate oxide, and the glass is likely to lose the transparency, and thus the glass composition is not suited for a package material that is heated for sealing. On the other hand, when a glass composition includes more than 10% $Al_2O_3$, air bubbles and cords are likely to occur when the glass melts, which might deform the shape during sealing and reduce the light transmittance of the glass composition. Therefore, from the viewpoint of restricting occurrence of transparency loss and cords and the like, the additive amount of $Al_2O_3$ is preferably at least 0.1% and at most 10%, and more preferably, at least 3% and at most 7%.

$Li_2O$, $Na_2O$ and $K_2O$ are not indispensable components, but may be added as appropriate so as to reduce the glass viscosity during melting to facilitate the melting and for any other purpose. However, if the additive amount of any of these components exceeds 50%, the thermal expansion coefficient of the glass becomes approximately 12 ppm/° C., and if a light source device includes the glass composition and a substrate made of ceramics, the difference in thermal expansion coefficient among the members becomes large, and cracks are likely to occur. Also, from the viewpoint of obtaining a desired refractive index, it is preferable that a total amount of these elements is in a range of 5-25%.

MgO, CaO, SrO and BaO are not indispensable components, but may be added as appropriate so as to improve the durability of the glass against chemical materials and reduce the glass viscosity during melting. However, if the additive amount of any of these components exceeds 20%, the glass viscosity is not reduced and thus a deformity point desired for a sealing material cannot be obtained. Also, since the thermal expansion coefficient of the glass becomes approximately 12 ppm/° C., if a light source device includes, for example, the glass composition and a substrate made of ceramics, the difference in thermal expansion coefficient among the members becomes large, and cracks are likely to occur. Also, from the viewpoint of obtaining a desired refractive index, it is preferable that a total amount of these elements is in a range of 5-25%.

The above component (k) SnO is not necessarily an indispensable element, but may be included in the composition since it produces an effect of reducing the glass viscosity during melting. However, if the additive amount of SnO exceeds 20%, the glass viscosity is not reduced and thus a deformity point desired for a sealing material cannot be obtained. Also, since the thermal expansion coefficient of the glass becomes approximately 12 ppm/° C., if a light source device includes, for example, the glass composition and a substrate made of ceramics, the difference in thermal expansion coefficient among the members becomes large, and cracks are likely to occur.

The above component (l) $B_2O_3$ is not necessarily an indispensable element, but may be included in the composition since it produces an effect of reducing the glass viscosity during melting or the like. However, if the additive amount of $B_2O_3$ exceeds 5%, the glass viscosity is not reduced and thus a deformity point desired for a sealing material cannot be obtained. Also, since the thermal expansion coefficient of the glass becomes approximately 12 ppm/° C., if a light source device includes, for example, the glass composition and a substrate made of ceramics, the difference in thermal expansion coefficient among the members becomes large, and cracks are likely to occur.

The glass composition of the present invention does not contain ZrO, and $Ag_2O$ since they remarkably increase the transparency loss. That is to say, the glass composition of the present invention does not contain Zr and Ag. For a similar reason, $Fe_2O_3$ is preferably not included in the glass composition of the present invention. That is to say, Fe is preferably not included in the glass composition of the present invention.

As described above, the glass composition of the present invention makes it possible to control the thermal expansion coefficient by adjusting the additive amount and the combination of the components appropriately. The thermal expansion coefficient of the glass composition in the present invention can be measured easily, for example, on a sample in a cylindrical shape that is 5 mm in diameter and 12 mm in length, with use of a thermomechanical analyzer (TMA) made by Rigaku Corporation.

The glass composition of the present invention is formed by adjusting the types and combination of the above components (a) to (l), especially by adjusting the amount of $P_2O_5$, SnO, ZnO and $Al_2O_3$ in an appropriate range, which makes the crystallization difficult to occur during heating and thus makes the transparency loss difficult to occur. Thus when the present glass composition is used as a package material for packaging a light-emitting element, it is possible to realize both the resistance against moisture and the resistance against heat, high light transmittance and high luminous flux. The transparency loss occurrence level of the glass composition of the present invention can be easily evaluated on a sample that is approximately 10 mm in length, by measuring the length of time required for the transparency loss to occur, with use of a gradient heating furnace (made by Motoyama Inc.).

The glass composition of the present invention has the glass transition temperature in the range of approximately 200-380° C. The glass transition temperature (Tg) means a temperature at which the glass changes from an elastic body to a viscous elastic body, and the thermal expansion coefficient greatly changes. In general, the semiconductor light-emitting element is manufactured and used in temperature range of approximately 50-150° C. However, when a glass transition temperature of, for example, a package material is included in the temperature range, cracks are likely to occur in the interfacial surface of the element and the package material or the like. In contrast, in the glass composition of the present invention, the glass transition temperature is included in a temperature range of 200-380° C. With this structure, a thermal change is not likely to occur when the semiconductor light-emitting element is actually used, and as a result, occurrence of cracks or the like is restricted.

The glass composition of the present invention is at most 400° C. in deformation point. The reason is considered to be that, in the case of the present invention, the internal structure of the glass composition is loosened by the addition of $P_2O_5$, ZnO, SnO and $SnO_2$, and results in reduction of the deformation point. In general, to seal a semiconductor light-emitting element, the sealing temperature is preferably at most 400° C. since the semiconductor element deteriorates by heat when it is heated for a long time. With regard to this point, the glass composition of the present invention has a deformation point of at most 400° C. and thus can reduce the temperature in the sealing process, and can decrease the possibility that the semiconductor element deteriorates by heat. The deformation point of the glass composition in the present invention can be measured easily, for example, on a sample in a cylindrical shape that is 5 mm in diameter and 12 mm in length, with use of a thermomechanical analyzer (TMA) made by Rigaku Corporation.

The glass composition of the present invention has a high refractive index of at least 1.65 since it contains predetermined amounts of SnO, ZnO, alkali metal and alkaline earth metal. Compared with a conventional $P_2O_5$—ZnO—SnO-based glass, the glass composition with high refractive index has high light extraction efficiency, and thus is useful as a package material for protecting an optical material such as a semiconductor light-emitting element. Note that the refractive index of the glass composition can be measured easily with use of a general-purpose device for measuring the refractive index of glass composition. For example, it can be measured easily, for example, on a sample that is approximately 10 mm in length, with use of a spectroscopic ellipsometer.

In the glass composition of the present invention in which the above components (a) to (l) are contained in respective appropriate ranges, (a)/(b), the ratio of the above component (a) $P_2O_5$ and the above component (b) ZnO, may be at least 0.2 and at most 2.0. Here, if the ratio of $P_2O_5$ and ZnO is more than 2.0 or less than 0.2, the crystal nucleation in the glass is enhanced, crystallization is likely to occur, and the transparency loss is likely to occur. This leads to reduction in light transmittance of the glass composition, and results in reduction of light flux. Note that, from the viewpoint of restricting the transparency loss and realizing high light flux, the ratio of $P_2O_5$ and ZnO, namely $P_2O_5$/ZnO is preferably 0.2-2.0, and more preferably, 0.5-1.5.

In the glass composition of the present invention, a total amount of the above component (a) $P_2O_5$ and the above component (b) ZnO is preferably at most 90% in mol %. Here, it is concerned that, if the total amount of these components exceeds 90%, the thermal expansion coefficient may increase remarkably due to remarkable loosening of the glass structure. However, controlling the total amount of the components in the above range enables a desired thermal expansion coefficient to be realized. Note that the lower limit value for the above total amount is not specifically specified in so far as it is in a range that enables a desired thermal expansion coefficient to be realized, but from the viewpoint of restricting the transparency loss, the total amount is preferably at least 60% in mol %.

The following explains an optical device in which the glass composition of the present invention is used as a package material for packaging a semiconductor light-emitting element, with reference to the drawings.

[Light Source Device]

As illustrated in FIG. 1, one example of a light source device 10 of the present invention includes a substrate 11, a semiconductor light-emitting element 12, a glass composition 13 covering the semiconductor light-emitting element 12, and a phosphor layer 14 covering a surface of the semiconductor light-emitting element 12.

The substrate 11, among the members constituting the light source device, is a member used as a basis on which the light-emitting element as the light source is mounted. Also, a wiring 15 and electrodes (not illustrated) for supplying electric current to the light-emitting element are formed on the substrate 11. The substrate is not limited to a specific type, but, in the present invention, the substrate is preferably made of ceramics. The reason is as follows. That is to say, as described above, the glass composition of the present invention has a thermal expansion coefficient in the range of 6-10 ppm/° C., which is realized by controlling the additive amount of ZnO and the like appropriately. Thus, when the glass composition of the present invention is used in combination with the above substrate such that the difference in thermal expansion coefficient becomes as small as possible, occurrence of cracks is restricted in particular in the vicinity of the interface, even during the heating.

The semiconductor light-emitting element 12 is a member functioning as an excitation light source. What can be used as the semiconductor light-emitting element of the present invention is, for example, an LED that emits blue light or ultraviolet light whose wavelength is in a range of 360-480 nm, namely a known blue-light LED having a single or multiple quantum well structure and having a light-emitting layer of InGaN, or a known near-ultraviolet LED having a single or multiple quantum well structure and having a light-emitting layer of AlINGaN, GaN or AlGaN, but is not specifically limited to these.

The phosphor layer 14 that covers the surface of the semiconductor light-emitting element 12 is a layer that, containing a phosphor material bound by a binder resin, absorbs a part of visible light or ultraviolet light emitted from the light-emitting element, and emits light that has a wavelength that is different from the wavelength of the absorbed light. Note that the phosphor layer 14 may further contain an additive such as an insulating adhesive (for example, a light-transmissive inorganic material such as epoxy resin, silicone resin or glass) for fixing the light-emitting element to the package, as well as the phosphor material or the like.

The phosphor material for the present invention is at least a phosphor that is excited by the light emitted from the semiconductor light-emitting element and emits light with converted wavelength, and is used as a wavelength conversion member together with a binder for binding the phosphor. Examples of the phosphor material for the present invention include RGB phosphor, aluminum-garnet-based phosphor and YAG-based phosphor, but the phosphor material for the present invention is not limited to these.

Also, when the light extraction efficiency is focused, the shape of the glass composition 13 is preferably, for example, a smooth dome as illustrated in FIG. 1. This is because the incident angle of the light that is incident on the surface of the glass composition 13 is small when the glass composition 13 is in the shape of a smooth dome, and thus the light can be extracted without total reflection. Note that, in the present invention, the glass composition 13 may have a shape that is parallel to the outer appearance of the semiconductor light-emitting element 12.

Also, in the present embodiment, a phosphor layer is provided as a layer covering the surface of the semiconductor light-emitting element 12. However, the phosphor layer may be provided as a package member directly covering the semiconductor light-emitting element 12 in the state of being contained in the glass composition of the present invention, or may be provided as a sheet-like phosphor layer with a gap from the surface of the package member or from the light-emitting element.

The glass composition 13, which is one of the structural elements of the light source device 10, functions as a sealing material covering the semiconductor light-emitting element 12. However, when the light source device 10 is adopted in a lighting device such as a bulb-shaped LED lamp which is described below, a thickness d of the glass composition 13 is preferably larger than thickness D of a member covered by the glass composition 13 (in FIG. 1, the thickness D is the shortest distance from the substrate 11 to the top surface of the phosphor layer 14), and is preferably at most 20 mm. Adjusting the thickness of the glass composition 13 in such an appropriate range enables the glass composition 13 to have high light flux, thus making it possible to obtain a lamp with high light flux. On the other hand, if the thickness d of the glass composition 13 is smaller than the thickness D of the member covered by the glass composition 13, there is a high possibility that the surface of the semiconductor light-emitting element 12 as a light source is not sufficiently covered, and as a result, light flux sufficiently high for the light source device 10 or the lamp cannot be obtained. Also, if the thickness d is larger than 20 mm, there is a possibility that the light extraction efficiency of the light source device 10 is reduced or that light flux sufficiently high for the lamp is difficult to be obtained. The reason is that, in general, the larger the thickness d is, the larger the amount of metals, such as $Fe^{2+}$ and $Fe^{3+}$, contained in the glass composition 13 is. The $Fe^{2+}$ and $Fe^{3+}$ in the glass composition 13 become a factor for reducing the light transmittance. Thus the presence of $Fe^{2+}$ and $Fe^{3+}$ in the glass composition 13 is likely to cause the above reduction of the light extraction efficiency in the light source device 10.

It is preferable that the glass composition 13 is formed in a shape including a curvature. For example, the glass composition 13 may be formed in a shape whose cross section taken in the thickness direction is semicircular. The reason is as follows. That is to say, the light emitted from the semiconductor light-emitting element 12 goes out into, for example, the air via the glass composition 13. In that case, if the shape of the glass composition 13 does not include a curvature as in a case where the interface between the glass composition 13 and the outside air is horizontally flat, the total reflectivity at the interface becomes high, and this increases the possibility that the light extraction efficiency is reduced.

Figure 2:
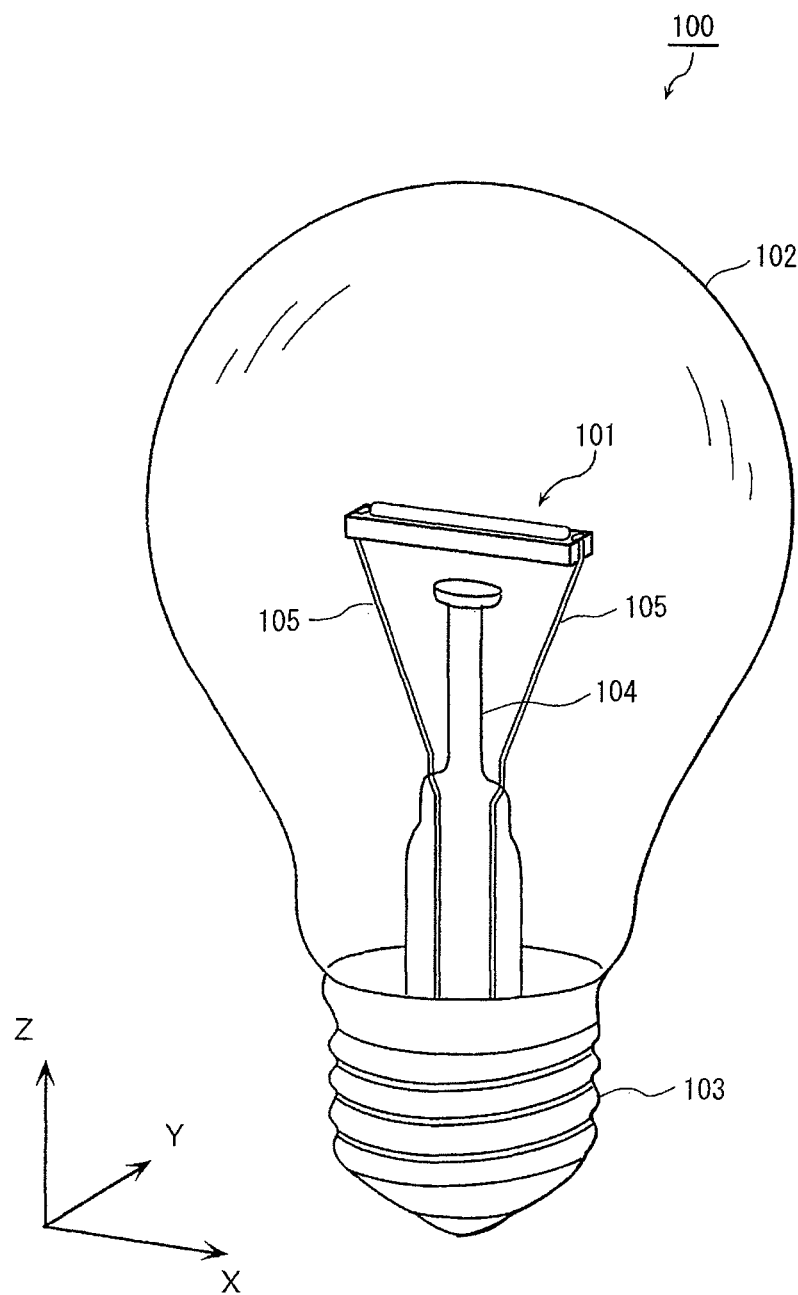
FIG. 2 is a perspective view of a bulb-shaped LED lamp adopting in itself the light source device in which the glass composition of the present invention is used as a package material.

The following describes a bulb-shaped LED lamp adopting in itself the light source device 10 of the present invention. As illustrated in FIG. 2, a bulb-shaped LED lamp 100 in the present embodiment of the present invention includes an LED module (light source device) 101, a globe 102 housing the LED module 101, and a base 103 attached to an opening of the globe 102. The bulb-shaped LED lamp 100 also includes a stem 104, two lead wires 105, and a lighting circuit (not illustrated).

[Globe]

The globe 102 is a housing in which the LED module 101, a light source device, is housed, and is a member that constitutes the outer shape of the lamp. From the viewpoint that it is a component of the lamp, the globe 102 is preferably made of a light-transmissive material. More specifically, the globe 102 is made of a resin represented by acrylic resin, or a glass composition represented by silica glass. In the present embodiment, a hollow member made of silica glass that is transparent with regard to the visible light is adopted as the globe 102. With adoption of such a globe 102 made of silica glass that is transparent with regard to the visible light, the LED module 101 housed in the globe 102 can be observed visually from outside the globe 102, and thus it is possible to provide a bulb-shaped LED lamp that resembles an incandescent bulb in outer appearance. Also, since the loss of light emitted from the LED module 101 by the globe 102 is restricted, it is possible to provide a bulb-shaped LED lamp having high light flux. Furthermore, if the globe 102 made of glass (including silica glass), not made of resin, is adopted in the lamp, the lamp can be used as an emergency lamp and so on since glass is highly resistant against heat.

The globe 102 is not limited to a specific shape, but in order to obtain a lamp as a substitute for a conventional incandescent bulb or bulb-shaped fluorescent lamp, the globe 102 may be formed in a shape whose one end is spherical and closed, and another end (base side) has an opening. In other words, the globe 102 is formed in a shape of a hollow sphere whose one end extend away from the center of the sphere to be narrower. In the present embodiment, the globe 102 is in the A shape (JIS C7710) as in a general incandescent bulb. Also, the globe 102 has an opening formed to be distant away from the center of the sphere.

Note that the globe 102 is not necessarily be formed in the A shape. For example, the globe 102 may be formed in the G shape, E shape or the like.

[Stem]

The stem 104 is provided to extend from the opening of the globe 102 toward the inside of the globe 102. More specifically, a rod-like extension unit that extends in the Z axis direction up to the vicinity of the LED module 101 is formed at one end of the stem 104. That is to say, the stem 104 of the present embodiment resembles a stem that is used in a general incandescent bulb and extends toward the inside of the globe 102. Note that the stem 104 may be a stem that is used in a general incandescent bulb.

The end of the stem 104 on the base side is preferably formed in a flared shape to match the shape of the opening. The end of the stem 104 formed in a flared shape is connected to the opening of the globe 102 such that the end closes the opening of the globe 102. Also, parts of the two lead wires 105 are sealed in the stem 104. With this structure, it is possible to supply power to the LED module 101 in the globe 102 from the outside of the globe 102 while the airtightness in the globe 102 is kept. As a result, the bulb-shaped LED lamp 100 can prevent the entrance of water or moisture into the globe 102 for a long time, and thus restrict the LED module 101 from deteriorating due to water and restrict a connection portion between the LED module 101 and the lead wires 105 from deteriorating.

The stem 104 is made of soft glass that is transparent with regard to the visual light. This structure enables the bulb-shaped LED lamp 100 to restrict the light generated by the LED module 101 from being lost by the stem 104. Also, the bulb-shaped LED lamp 100 can prevent formation of a shadow by the stem 104. Furthermore, since the stem 104 shines by white light emitted from the LED module 101, the bulb-shaped LED lamp 100 can be visually beautiful. Note that the stem 104 does not necessarily close the opening of the globe 102, but may be attached to a part of the globe 102 near the opening.

[LED Module]

The LED module 101, which functions as a light source device in the present invention, is housed in the globe 102 while being supported by the two lead wires 105, which function as a power supply member, to be in the air inside the globe 102. Also, the LED module 101 is arranged such that a surface thereof, in which a plurality of semiconductor light-emitting elements 108 are implemented, faces the globe 102 (positive direction of the Z direction). During lighting, power is supplied to the LED module 101 via the two lead wires 105, and the semiconductor light-emitting elements of the LED module 101 emit light.

The LED module 101 is not limited to a specific position, but from the viewpoint of obtaining an LED lamp as a substitute for a conventional incandescent bulb, the LED module 101 is preferably arranged at the center of the sphere formed by the globe 102. More specifically, for example, the LED module 101 is arranged at a position where the inner diameter of the globe 102 is the largest. When the LED module 101 is arranged at the center of the globe 102 as described above, it is possible to provide the bulb-shaped LED lamp 100 that realizes an omnidirectional lighting in a similar manner to a general incandescent bulb in which a conventional filament coil is used to emit light.

Figure 3A:
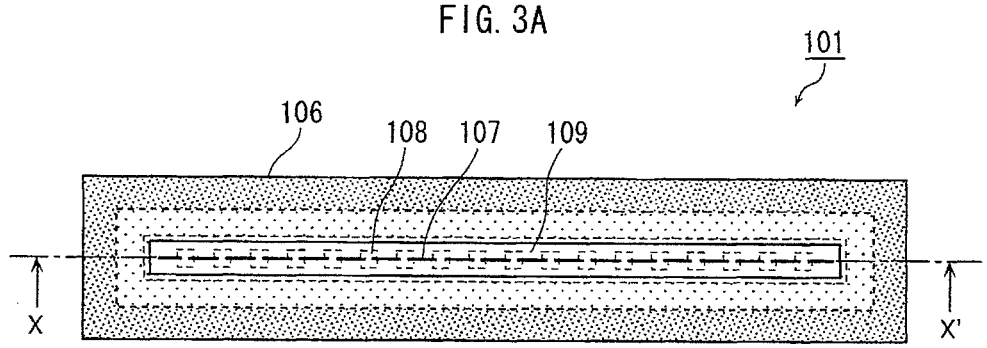
FIG. 3A is a plan view of the light source device in which the glass composition of the present invention is used as a package material.
Figure 3B:
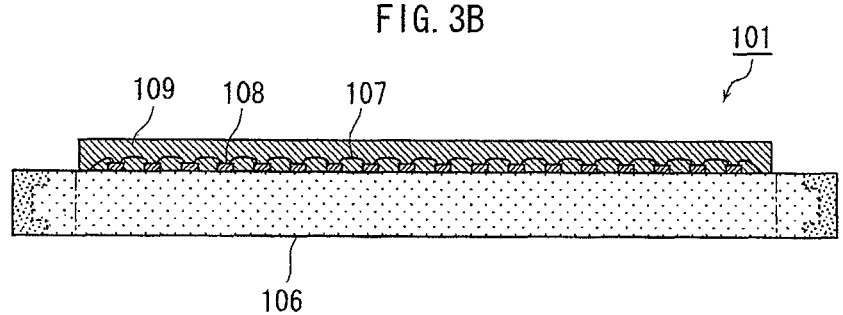
FIG. 3B is a cross-sectional view of the light source device.

As illustrated in FIGS. 3A and 3B, the LED module 101 of the present embodiment includes a rectangular substrate 106, a plurality of semiconductor light-emitting elements 108 that are connected by a wire 107, and a sealing material 109. The sealing material 109, including the glass composition of the present invention, covers a circumference of the plurality of semiconductor light-emitting elements 108 arranged in a block.

The following describes details of the members included in the LED module 101, wherein description is omitted with regard to the members that have been described above with reference to FIG. 1, and provides description of only such structures that are remarkably preferred for the case where a bulb-shaped LED lamp that is transparent with regard to the visible light (such a bulb-shaped LED lamp is also referred to as a clear LED bulb) as in the present embodiment is adopted.

When the LED module 101 is applied to the clear LED bulb, the substrate 106 of the LED module 101 is preferably made of a material that can transmit light emitted from the sealing material 109. This structure allows part of the light emitted from the semiconductor light-emitting elements 108 to be emitted to outside via a back surface of the substrate 106, namely via a surface that is different from a surface on which the semiconductor light-emitting elements 108 are implemented. This broadens the angle of the light emission. As one example, the substrate 106 may be a light-transmissive ceramics substrate composed of ceramic particles. In the present embodiment, the substrate 106 is, as one example, an alumina substrate composed of alumina (aluminum oxide: $Al_2O_3$) particles.

Also, the glass composition of the present invention can be used suitably as a COB-type sealing material for the semiconductor light-emitting elements to be implemented directly on the substrate, and can be used as an SMD-type sealing material for the semiconductor light-emitting elements to be implemented in a cavity made by resin.

In the above embodiment, the light source device of the present invention is applied to a bulb-shaped LED lamp that can be used as a substitute for a conventional incandescent bulb. However, not limited to this form, the light source device of the present invention can be applied to, for example, a straight tube LED lamp that can be used as a substitute for a straight tube fluorescent lamp.

Figure 4:
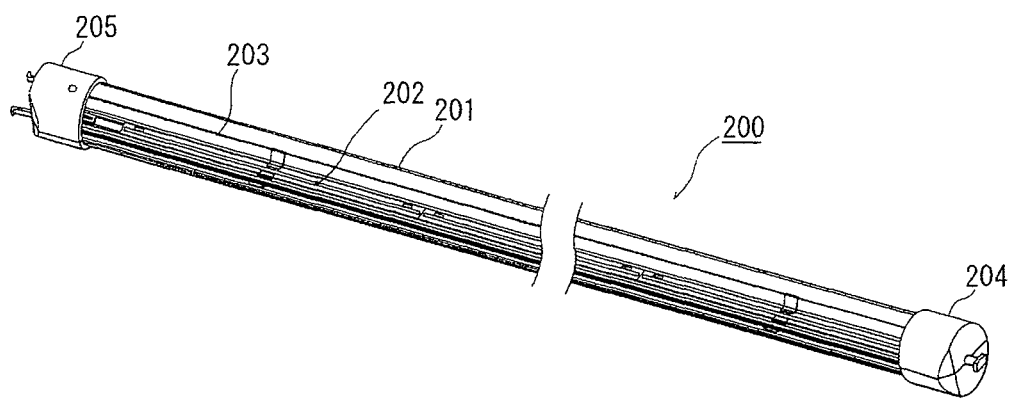
FIG. 4 is a perspective view of a straight tube LED lamp adopting in itself the light source device in which the glass composition of the present invention is used as a package material.

As illustrated in FIG. 4, a straight tube LED lamp 200 is an LED lamp that is approximately in the same shape as a conventional straight tube fluorescent lamp in which an electrode coil is used.

The straight tube LED lamp 200 includes a housing 201 having a shape of an elongated cylinder, a plurality of LED modules 202 arranged in the housing 201, a substrate 203 on which the LED modules are arranged, and a first base 204 and a second base 205 provided at both ends of the housing 201. The LED modules 202 are laid on a surface of the substrate 203 that extends in the longitudinal direction of the housing 201.

The housing 201 is a member for housing the LED modules 202 and the substrate 203, and has openings at respective ends thereof. The housing 201 is not limited to a specific material, but is preferably made of a light-transmissive material. For example, the housing 201 may be made of glass or resin such as plastic.

The cross section of the housing 201 is not limited to a specific shape, and may be annular or angular. More specifically, the cross-section of the outer circumference may be angular or hemicircular, and the cross-section of the inner circumference may be circular, hemicircular, or angular. For example, when the cross-section of the inner circumference of the housing 201 is hemicircular (such a housing is referred to as a "first housing"), a second housing formed from an aluminum plate or the like may be prepared, and the housing 201 may be formed as a combination of the first and second housings. In this case, the second housing may be made from a member that acts as a substrate 203 which is described below.

It is preferable that the substrate 203 also functions as a heat radiator (heatsink) for radiating the heat of the LED modules 202. Accordingly, the substrate 203 is preferably made of a highly thermally conductive material such as a metal. In the present embodiment, the substrate 203 is an elongated substrate made of aluminum. Also, the substrate 203 of the present embodiment extends up to the vicinities of the first base 204 and the second base 205, and the total length of the substrate 203 is substantially the same as the length of the housing 201.

Furthermore, the substrate 203 is preferably in contact with the first base 204 and the second base 205 so that the heat is transferred therebetween. The reason is as follows. That is to say, when the straight tube LED lamp 200 is attached to external lighting equipment, the first base 204 and the second base 205 contact the lighting equipment and act as a holding member. Accordingly, when the substrate 203 is in contact with the first base 204 and the second base 205, the heat from the LED modules 202 is directly transferred to the lighting equipment via the substrate 203. Thus this structure further enhances the heat radiation.

The first base 204 and the second base 205 are bases that are provided at both ends of the housing 201 and are to be detachably attached to sockets of the lighting equipment.

It is preferable that the first base 204 and the second base 205 have different shapes as in the present embodiment (in the present embodiment, they are different in the number of pins attached thereto and in shape). This is because this structure produces an advantageous effect that the straight tube LED lamp 200 is prevented from being attached erroneously to lighting equipment for a conventional fluorescent lamp. Also, the first base 204 may be provided with one pin as an earth pin for earthing, and the second base 205 may be provided with two pins as power supply pins for receiving power so as to obtain the straight tube LED lamp 200 that receives power supply only through the second base 205 provided at one end of the housing 201. This structure produces an advantageous effect that even if a person attaches the straight tube LED lamp 200 to lighting equipment by erroneous adaptation, the person is prevented from electric shock.

[Working Example]

The following describes a working example in which the glass composition of the present invention is applied to the light source device, and a comparative example.

In the working example and the comparative example, as shown in Table 1, the materials of the glass were mixed in oxide-based mol %, and then were fused for one hour at 1000° C. The products of the fusing were cooled gradually, and the resulted glass pieces were used as the respective samples.

TABLE 1

| | Item | Working example | | | Comparative example | | | |
|---|---|---|---|---|---|---|---|---|
| | | 1 | 2 | 3 | 5 | 6 | 7 | 8 |
| Composition | $P_2O_5$ | 39 | 39 | 34 | 35 | 40 | 40 | 40 |
| | ZnO | 40 | 35 | 40 | 20 | 15 | 33 | 40 |
| | $Al_2O_3$ | 1 | 1 | 1 | 5 | 5 | 5 | 5 |
| | $K_2O$ | | | | 15 | 15 | | |
| | SnO | 20 | 20 | 20 | | | | |
| | $Li_2O$ | | 5 | 5 | 15 | 15 | 10 | 10 |
| | $Na_2O$ | | | | 5 | 5 | | |
| | BaO | | | | | | | |
| | MgO | | | | | | | |
| | $B_2O_3$ | | | | | | | |
| | $ZrO_2$ | | | | 5 | 5 | | |
| | $Ag_2O$ | | | | | | 2 | 5 |
| | $Cs_2O$ | | | | | | | |
| Property | (1) transparency loss occurrence level | ○ | ○ | ○ | x | x | x | x |
| | (2) thermal expansion coefficient (ppm) | 8.35 | 9.57 | 8.99 | — | — | — | — |
| | (3) time required for transparency loss to occur (450° C.) | 60 | 60 | 60 | — | — | — | — |
| | (4) glass transition point (° C.) | 348 | 308 | 325 | — | — | — | — |
| | (5) deformation point | 391 | 347 | 362 | — | — | — | — |
| | (6) refractive index | 1.62 | 1.6 | 1.6 | — | — | — | — |
| | (7) visual light transmittance % (2 mm thick) | 90 | 90 | 90 | — | — | — | — |
| | (8) oxygen gas transmittance ($cc/m^2 \cdot day$). | 100 | 100 | 100 | — | — | — | — |
| | (9) resistance against ultraviolet (light transmittance after radiation of UV-B at 162 $W/m^2$ for 150 hours) | 88 | 88 | 88 | — | — | — | — |

The sign "○" indicates "excellent"; and the sign "x" indicates "bad".

For the prepared samples, measurement and evaluation were made with regard to (1) transparency loss occurrence level, (2) thermal expansion coefficient, (3) time required for transparency loss to occur at 450° C., (4) glass transition point, (5) deformation point, (6) refractive index, (7) visual light transmittance, (8) oxygen gas transmittance, and (9) ultraviolet transmittance. Note that with regard to the above (1) to (6), the above-described measurement methods were adopted, and with regard to the above (7) to (9), the following measurement methods were adopted.

Each measurement sample was a glass plate with a diameter of φ10 mm and a thickness of 2 mm. The visual light transmittance was measured by JASDCO FP-6500 made by JASCO Corporation. The measurement was made in a wavelength region of 400-750 nm, and the average of the measured transmittance values was calculated as the visual light transmittance.

The gas transmittance was measured by the JIS K 7127 moisture sensor method stipulated in the Industrial Standardization Act (Japan).

The resistance against ultraviolet was evaluated by radiating UV-B at the strength of 162 W/m² for 150 hours onto the manufactured glass samples, and then measuring the visual light transmittance thereof.

As apparent from the results shown in Table 1, the glass composition of the present invention has a thermal expansion coefficient of approximately 8-10, which is very close to the thermal expansion coefficient (6-10 ppm/° C.) of a substrate made of ceramics such as $Al_2O_3$, wherein the glass composition of the present invention is formed by adjusting the amount of the components in an appropriate range. This indicates that the difference in thermal expansion coefficient between the glass composition and the ceramics substrate is restricted to a small value, and it is possible to restrict the occurrence of cracks which would occur due to the difference in thermal expansion coefficient between the members when the glass is sealed. Also, in general, the thermal expansion coefficient of a glass composition greatly changes at the glass transition point. Accordingly, when the glass transition point is within a practical-use temperature range such as the sealing temperature range, cracks are likely to occur during the practical use. In this respect, each working example of the glass composition of the present invention has a glass transition point of approximately 300-350° C., which is higher than a practical-use temperature 250° C. Thus the thermal expansion coefficient is not likely to change even during sealing, which makes it possible to restrict occurrence of cracks.

In general, the time required for glass transparency loss to occur at 450° C. is approximately 45 hours or more in the case of a ceramics substrate. On the other hand, in each working example of the glass composition of the present invention, the time is approximately 60 hours. That is to say, the glass composition of the present invention is approximately 1.5 times the ceramics substrate in time required for glass transparency loss to occur. This indicates that, in the glass composition of the present invention, crystallization is difficult to occur even during sealing.

Furthermore, in all working examples of the glass composition of the present invention, the deformation point is lower than 400° C. In general, when a light-emitting element is heated for a long time at a temperature higher than 400° C., it is deteriorated due to heat and the light flux is lowered. In view of this problem, the sealing temperature of the light-emitting element is preferably at most 400° C., and the glass composition needs to be softened at 400° C. or lower. In this respect, the glass composition of the present invention is useful as a sealing material for the light-emitting element.

Furthermore, when the light transmittance of the glass is reduced, the light extraction efficiency in extracting light from the light-emitting element is reduced as well. As a result, from the viewpoint of increasing the light extraction efficiency, in general, the glass composition is required to have a high refractive index of 1.55 or more. In this respect, in all working examples of the glass composition of the present invention, the refractive index is 1.6 or more. This indicates that the present invention makes it possible to obtain a glass composition having high light transmittance.

Furthermore, when the glass composition transmits a large amount of oxygen gas, the light-emitting element constituting the light source device or an Ag plate may be deteriorated. As a result, the glass composition for sealing the light-emitting element requires an oxygen gas transmittance of approximately 100 (ml/m² day). In this regard, all working examples of the glass composition of the present invention have an oxygen gas transmittance of approximately 100 (ml/m² day), and thus the problem of deterioration of the light-emitting element or the like is solved.

Also, when the glass composition has a low ultraviolet transmittance, color deterioration (short life) is likely to occur when the glass composition is used as a sealing material for sealing the light-emitting element or the like. As a result, the glass composition is required to have ultraviolet transmittance of at least 70%. In this respect, all working examples of the glass composition of the present invention have a high ultraviolet transmittance of approximately 88%.

INDUSTRIAL APPLICABILITY

The glass composition of the present invention is useful as a package material for covering an optical member such as a semiconductor light-emitting element. Also, the light source device, in which the glass composition is used as a package material for packaging the semiconductor light-emitting element, can be used in a backlight light source for a liquid crystal display panel, a general-purpose lighting, and a car-mounted lighting device.

REFERENCE SIGNS LIST

10 light source device
11 substrate
12 semiconductor light-emitting element
13 glass composition
14 phosphor layer
15 wiring
100 lamp
101 module
102 globe
103 base
104 stem
105 lead wire
106 substrate
107 wire
108 semiconductor light-emitting element
109 sealing material
200 lamp
201 housing
202 module
203 substrate
204, 205 base

The invention claimed is:

1. A glass composition that is $P_2O_5$—ZnO—SnO—$Al_2O_3$-based and does not contain Sb, the glass composition comprising, in oxide-based mol %:
(a) at least 30% and at most 50% $P_2O_5$, (b) at least 10% and at most 50% ZnO, (c) at least 0.1% and at most 10% $Al_2O_3$, (d) at least 0% and at most 50% $Li_2O$, (e) at least 0% and at most 50% $Na_2O$, (f) at least 0% and at most 50% $K_2O$, (g) at least 0% and at most 20% MgO, (h) at least 0% and at most 20% CaO, (i) at least 0% and at most 20% SrO, (j) at least 0% and at most 20% BaO, (k) at least 0% and at most 20% SnO, and (l) at least 0.2% and at most 5% $B_2O_3$, substantially not comprising $ZrO_2$ and $Ag_2O$, and (a)/(b), the ratio of (a) and (b), being at least 0.2 and at most 2.0.

2. The glass composition of claim 1, wherein a total amount of (a) and (b) is at most 90% in mol %.

3. A light source device comprising:

a substrate; and a light-emitting element implemented on the substrate in a state of being sealed by the glass composition recited in claim 1.

4. The light source device of claim 3, wherein the substrate is made of ceramics.

5. The light source device of claim 4, wherein a thermal expansion coefficient of the glass composition is at least 6 ppm/° C. and at most 10 ppm/° C.

6. The light source device of claim 4, wherein the glass composition includes a phosphor material.

7. A lighting device comprising:

a light source device recited in claim 3;

a housing in which the light source device is placed; and a base attached to the housing.

8. The lighting device of claim 7, wherein the housing is made of a light-transmissive material.

* * * * *